(12) United States Patent
Spasic et al.

(10) Patent No.: US 11,614,503 B2
(45) Date of Patent: Mar. 28, 2023

(54) MAGNETIC SENSOR WITH LOW NOISE AND A HIGH BANDWIDTH (71) Applicant: Senis AG, Zug (CH)

(72) Inventors: Sasa Spasic, Zug (CH); Radivoje Popovic, Zug (CH)

(73) Assignee: Senis AG, Zug (CH)

( * ) Notice: Subject to any disclaimer, the term of this patent is extended or adjusted under 35 U.S.C. 154(b) by 0 days.

(21) Appl. No.: 17/293,930

(22) PCT Filed: Nov. 14, 2019

(86) PCT No.: PCT/IB2019/059785
§ 371 (c)(1),
(2) Date: Jun. 8, 2021

(87) PCT Pub. No.: WO2020/100078
PCT Pub. Date: May 22, 2020

(65) Prior Publication Data
US 2022/0128635 A1 Apr. 28, 2022

(30) Foreign Application Priority Data
Nov. 14, 2018 (DE) .............................. 102018128469

(51) Int. Cl.
G01R 33/07 (2006.01)

(52) U.S. Cl.
CPC .................................... *G01R 33/07* (2013.01)

(58) Field of Classification Search
CPC ...... G01R 33/07; G01R 33/075; G01R 15/205
See application file for complete search history.

(56) References Cited

U.S. PATENT DOCUMENTS

| 6,366,076 | B1 | 4/2002 | Karrer et al. |
| 2013/0320970 | A1* | 12/2013 | Foletto ................ G01D 5/2448 |
| | | | 324/251 |
| 2017/0030979 | A1* | 2/2017 | Cesaretti ............ G01R 33/0035 |
| 2018/0340986 | A1* | 11/2018 | Latham ................. G01B 7/003 |
| 2019/0312579 | A1* | 10/2019 | Romero ............... G01R 33/077 |
| 2019/0369168 | A1* | 12/2019 | Ruck .................. G01R 33/0029 |

FOREIGN PATENT DOCUMENTS

| DE | 102010031142 A1 | 11/2011 |
| EP | 1679524 A1 | 7/2006 |
| EP | 3355475 A1 | 8/2018 |

* cited by examiner

Primary Examiner — Alvaro E Fortich
(74) Attorney, Agent, or Firm — Michael Soderman (57) ABSTRACT A magnetic field sensor system comprising a first magnetic field sensor, one or more second magnetic field sensors and an amplifier and all magnetic field sensors are connected in series so that the respective output signals can be added up to a common input signal of the amplifier.

12 Claims, 9 Drawing Sheets

MAGNETIC SENSOR WITH LOW NOISE AND A HIGH BANDWIDTH

CROSS REFERENCE TO RELATED APPLICATIONS

This application is the U.S. national stage of International Application No. PCT/IB2019/059785, filed on 2019 Nov. 14. The international application claims the priority of DE 102018128469 filed on 2018 Nov. 14; all applications are incorporated by reference herein in their entirety.

BACKGROUND

Technical Area

The present invention is related to a magnetic field sensor according to claim 1.

State of the Art

From the state of the art, sensors for measuring a magnetic field, in particular also Hall magnetic field sensors, are known in a sufficiently wide variety and high diversity.

Very detailed the fundamentals of Hall magnetic field sensors are described for example in R. S. Popovic: "Hall effect devices", Journal for Sensors and Actuators, Volume 17, Issues 1-2, 3 May 1989, Pages 39-53 or in R. S. Popovic "Hall Effect Devices", 2nd Edition CRC Press Taylor & Francis Group, LLC 2003, ISBN: 978-1-4200-3422-6.

Furthermore, the present invention is related to the disclosure of the U.S. Pat. No. 6,366,076 B1. Therein, a current sensor is described that, in addition to a low-pass filter, combines a low-frequency magnetic field sensor, such as a Hall effect sensor, and an inductive coil, such as a Rogowski coil, and a summing device to sum signals from the Hall effect sensor and the inductive coil.

An effect of the present invention associated with the measurement principle and the sensor structure itself, as well as an arrangement of the sensor within a measurement circuit, is a bandwidth-limited input measurement signal and a noise-superimposed output measurement signal.

A known method for reducing offset and low frequency noise of Hall effect devices is the use of a switch-based three-phase technique known as spinning current technique in combination with the so-called chopper stabilization technique. This use in sensor systems comprising a Hall effect sensor results in a reduction of the offset and low frequency noise of the Hall effect device and of an amplifier that amplifies the Hall voltage.

These and additional approaches of the above mentioned prior art do provide new methods and circuit arrangements, but they do not provide in the slightest a solution approach for reduction of the white noise part of the noise spectrum of a Hall effect sensor system.

To the currently known magnetic field sensors belong also known silicon integrated Hall effect sensors, which are also suitable for the measurement of magnetic fields. These have an insufficient measurement resolution and a frequency bandwidth that is too low for many modern applications.

Although namely silicon integrated Hall effect sensors as discrete devices can have a spectral density of the noise equivalent magnetic induction ($_{SNEMF-SD}$) of about 50 nT√Hz, such sensors currently can typically only have a $_{SNEMF-SD}$>100 nT√Hz (nT=nanotesla and Hz=hertz).

Also, known silicon integrated Hall effect sensors for measuring magnetic fields typically have a frequency bandwidth (BW) of DC (direct current) to less than 200 kHz (kilohertz), although a frequency bandwidth of DC to several MHz (megahertz) would be required for a variety of applications.

The reason for these two disadvantages of silicon integrated Hall effect sensors for high-resolution measurement of broadband magnetic fields is due to the fact that the Hall voltage of a silicon integrated Hall effect sensor is already very low by itself.

The low measurement resolution of a silicon integrated Hall effect sensor (Hall magnetic field sensor) of magnetic fields arises because, at a weak magnetic field, the Hall voltage, may not be too affected by the inherent noise of the Hall effect sensor, but may be lower than the input-related noise of the integrated amplifier itself.

In other words, within the noise budget of the modern silicon integrated Hall magnetic field sensor system, the noise of the amplifier as such is dominating.

The limitation of the bandwidth arises because the amplifier has to work with a high gain due to the low Hall voltage and the cut-off frequency of the amplifier is low due to the limited gain-bandwidth product of the integrated amplifier.

In principle, both the input-related noise of an integrated amplifier and its gain bandwidth product could be improved by increasing the area of the silicon chip occupied by the amplifier and by increasing the power consumption of the amplifier. But then, such a silicon integrated Hall magnetic field sensor would be too expensive and impractical to handle.

An objective of the invention, in addition to overcoming the aforementioned disadvantages of the prior art, is to improve the performance of magnetic field sensor systems, in particular Hall effect based ones, with respect to their measurement resolution of a magnetic field to be measured and the frequency bandwidth of the magnetic field to be measured.

SUMMARY

A magnetic field sensor system comprising a first magnetic field sensor, one or more second magnetic field sensors and an amplifier and all magnetic field sensors are connected in series so that the respective output signals can be added up to a common input signal of the amplifier.

DETAILED DESCRIPTION

In a first aspect of the invention, a magnetic field sensor system comprises a first magnetic field sensor, one or more second magnetic field sensors, and an amplifier.

Also, in the sense of the invention, a magnetic field sensor system may comprise a first magnetic field sensor and/or a magnetic field sensor subsystem and one or more second magnetic field sensors and an amplifier.

The magnetic field sensor subsystem comprises a first magnetic field sensor connected in combination with at least one further component selected from the group consisting of Hall effect sensors, magnetoresistive sensors, induction loops or induction coils, and a further amplifier, and wherein the component is connected upstream of the further amplifier.

Preferably, all magnetic field sensors are so dimensioned and designed to measure magnetic fields in the range up to 1 mT (millitesla) or up to 3 mT, preferably up to 10 mT or 30 mT, and more particularly up to 100 mT or 300 mT, preferably in a temperature environment of −40° C. to +125° C.

According to the invention, the magnetic field sensors and/or the magnetic field sensor subsystem are connected in series with the input of the amplifier in order to add-up the respective output signals to a common input signal of the amplifier.

Preferably, the magnetic field sensors and/or the magnetic field sensor subsystem are connected cascaded in series with the input of the amplifier in order to add-up the respective output signals to a common input signal of the amplifier.

According to a second aspect of the invention, in a magnetic field sensor system, preferably, a supply contact of the first magnetic field sensor is connected to a voltage source, and all remaining supply contacts of the magnetic field sensors are each connected to a constant current source or to a constant current sink.

Preferably, the first magnetic field sensor and one or more of the second magnetic field sensors is a component selected from the group consisting of Hall effect sensors, magnetoresistive sensors in, preferably Wheatstone's, bridge circuit, induction loops or induction coils, or any combination thereof.

This has for example at a combination of a Hall effect sensor with an inductive component the advantage that at the measurement of a magnetic field a high measuring resolution is achievable over a wide frequency band, because at lower frequencies the output voltage of the Hall effect sensor dominates and at higher frequencies the low-noise output voltage of the inductive component dominates, so that at a series connection the signal-to-noise ratio of the output voltage is over the whole frequency bandwidth larger than one of the individual output voltages.

According to another aspect of the invention, at a magnetic field sensor system comprising a magnetic field sensor subsystem, the magnetic field sensor subsystem comprises a combination of at least one component selected from the group consisting of Hall effect sensors, magnetoresistive sensors in, preferably Wheatstone's, bridge circuit, induction loops or induction coils, and a further amplifier, wherein the component is connected downstream of the further amplifier.

Preferably, therefore, the output contacts of the magnetic field sensor subsystem are electrically coupled to the input contacts of the further amplifier for this purpose.

According to another aspect of the invention, a magnetic field sensor system and a magnetic field sensor subsystem as well as only a magnetic field sensor system or a magnetic field sensor subsystem comprises switchable contacts for an operation by means of spinning current technique or chopper stabilization.

Preferably, a magnetic field sensor system and a magnetic field sensor subsystem as well as only a magnetic field sensor system or a magnetic field sensor subsystem comprises switchable contacts for an operation by means of spinning current technique or chopper stabilization.

This has the advantage that in the case of the spinning-current current operation or of a chopper stabilization as well as in a combined application of a spinning-current current operation together with a chopper stabilization, the DC as well as the low frequency performance of an integrated system is significantly improved.

According to another aspect of the invention, a magnetic field sensor system additionally comprises—in presence of an induction loop or an induction coil as part of the magnetic field sensor system—an integrator or a low-pass filter for compensating the frequency dependency of the voltage induced in the induction loop or in the induction coil.

According to one aspect of the invention—in the presence of a combination of a Hall effect sensor or a magnetoresistive sensor such as an AMR-sensor or a GMR-sensor in, preferably Wheatstone's, bridge circuit and an inductive loop or an inductive coil as part of the magnetic field sensor system—the inductive element is connected such that the phase of a voltage $V_L$ induced therein is biased relatively to the phase of the voltage of the Hall effect sensor or the magnetoresistive sensor.

According to another aspect of the invention, in a magnetic field sensor system, the first magnetic field sensor and at least one of the second magnetic field sensors and the magnetic field sensor subsystem is embodied as an integrated circuit.

According to another aspect of the invention, in a magnetic field sensor system, the first magnetic field sensor and at least one of the second magnetic field sensors or the magnetic field sensor subsystem is embodied as an integrated circuit.

According to another aspect of the invention, in a magnetic field sensor system, the first magnetic field sensor or at least one of the second magnetic field sensors and the magnetic field sensor subsystem is embodied as an integrated circuit.

According to another aspect of the invention, in a magnetic field sensor system, the first magnetic field sensor or at least one of the second magnetic field sensors or the magnetic field sensor subsystem is embodied as an integrated circuit.

According to another aspect of the invention, the magnetic field sensor system is preferably embodied as an integrated circuit. Preferably, the integrated circuit is thereby connected in series with an induction loop, preferably connected externally, or an induction coil, preferably connected externally, in order to add-up the output signals in this way. This has the advantage that a much stronger output signal can be formed. In the case of a downstream amplifier, the individually added-up, partially in detail also weak output signals are therefore present as a strong input signal at the input of the amplifier. In this way, the inherent noise of the amplifier thus no longer superimposes both phase and amplitude of the signal to be amplified.

According to another aspect of the invention, the integrated circuit of a magnetic field sensor system comprises at least one Hall effect sensor for each spatial direction component of a magnetic field vector, and the induction loop or the induction coil or a combination thereof surrounds at least partially spatially the integrated circuit such that all spatial direction components of the magnetic field vector are detectable.

According to another aspect of the invention, the integrated circuit of a magnetic field sensor system comprises at least one Hall effect sensor and an induction loop or an induction coil for each spatial direction component of a magnetic field sector such that one, two or three spatial direction components of the magnetic field vector are detectable.

According to another aspect of the invention, Hall effect sensors are preferably arranged horizontally and thus parallel to the surface of a chip in the case of an integrated Hall effect sensor or vertically and thus perpendicular to the surface of a chip in the case of an integrated Hall effect sensor. This has the advantage that horizontally aligned Hall effect sensors respond to a magnetic field component perpendicular to the chip plane, whereas the vertically aligned Hall effect sensors respond to a magnetic field component parallel to the chip surface. In the case of a combination of a Hall effect sensor with an inductive component, the sensitivity direction of the Hall effect sensor and the inductive component as sensor element must match.

According to another aspect of the invention, the value of the $S_{NEMF-SD}$ of a magnetic field sensor or of a magnetic field sensor subsystem is close to that of a commercially available silicon integrated Hall effect sensor such as, for example, of type Allegro A1324, A1325 or A1326, of type AKM EQ-430L, EQ-431L, EQ-432L or EQ-433L or of type LEM FHS Minisense, preferably in the range of 50 (+/−max 10) nT√Hz.

According to another aspect of the invention, the frequency bandwidth (BW) of a magnetic field sensor or a magnetic field sensor subsystem is in the range of direct current (DC) or 0 Hz to at least 1 MHz or 2 MHz, preferably to 3 MHz and more particularly to max. 5 MHz.

According to another aspect of the invention, a preferred magnetic field sensor system comprises a Hall effect sensor and an inductive component connected in series, wherein both the output signal of the Hall effect sensor and the output signal of the inductive component are amplified by the same factor, so that a magnetic field measurement range of 5 mT to 3 T in a low frequency range with a bandwidth of 0 Hz (DC) to 1 kHz with a measurement resolution of 500 nT, i.e. with a factor $10^4$ of the smallest measuring range of 5 mT measuring range, otherwise with a factor $10^{-5}$ of the measuring range can be covered.

According to another aspect of the invention, a preferred magnetic field sensor system comprises a Hall effect sensor and an inductive component connected in series, wherein the output signal of the Hall effect sensor is stronger amplified than the output signal of the inductive component so that a magnetic field measurement range of 5 mT to 300 mT in a medium frequency range with a bandwidth of 0 Hz (DC) to 200 kHz can be covered with a measurement resolution of 5 mT, i.e. with a factor $10^{-3}$ of the smallest measurement range of 5 mT measurement range, otherwise with a factor $10^4$ of the measurement range can be covered.

According to another aspect of the invention, a preferred magnetic field sensor system comprises a Hall effect sensor and an inductive component connected in series, wherein the output signal of the Hall effect sensor is stronger amplified than the output signal of the inductive component so that a magnetic field measuring range of 3 mT to 30 mT in a high frequency range with a bandwidth of 0 Hz (DC) to 2 MHz can be covered with a measurement resolution of 15 μT (microtesla), i.e. with a factor $5 \times 10^{-2}$ of the smallest measuring range of 3 mT measurement range, otherwise with a factor $10^{-3}$ of the measurement range, can be covered.

BRIEF DESCRIPTION OF THE DRAWINGS

Further advantageous embodiments of the inventions will be apparent from the figures together with the corresponding detailed description.

These show in

DETAILED DESCRIPTION OF THE PREFERRED EMBODIMENTS

Figure 1:
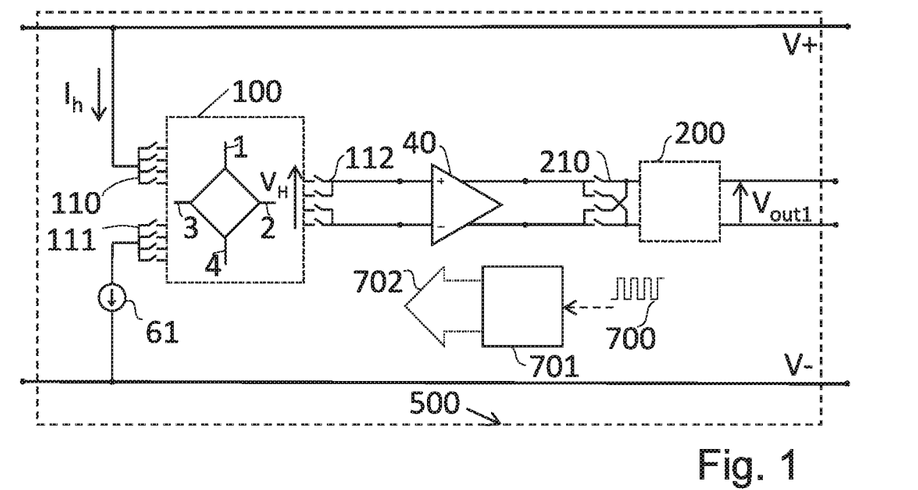
FIG. 1 a block diagram of a typical Hall magnetic field sensor subsystem known from the prior art.
Figure 5:
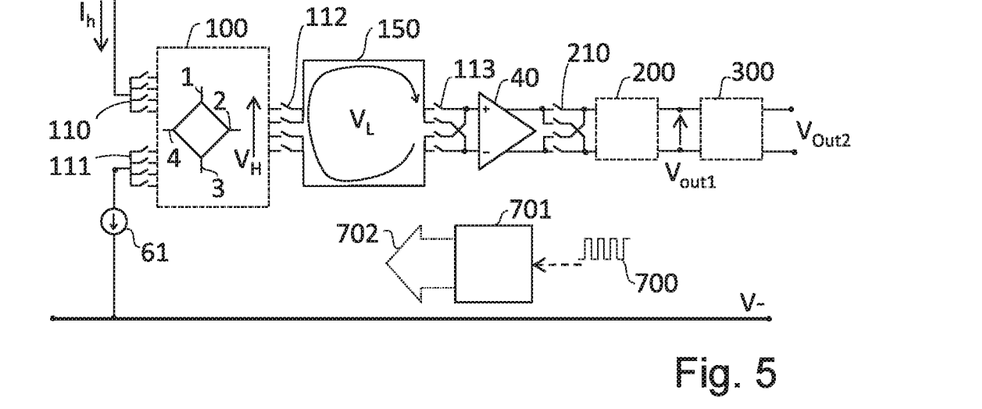
FIG. 5 a block diagram of a preferred magnetic field sensor system.
Figure 6:
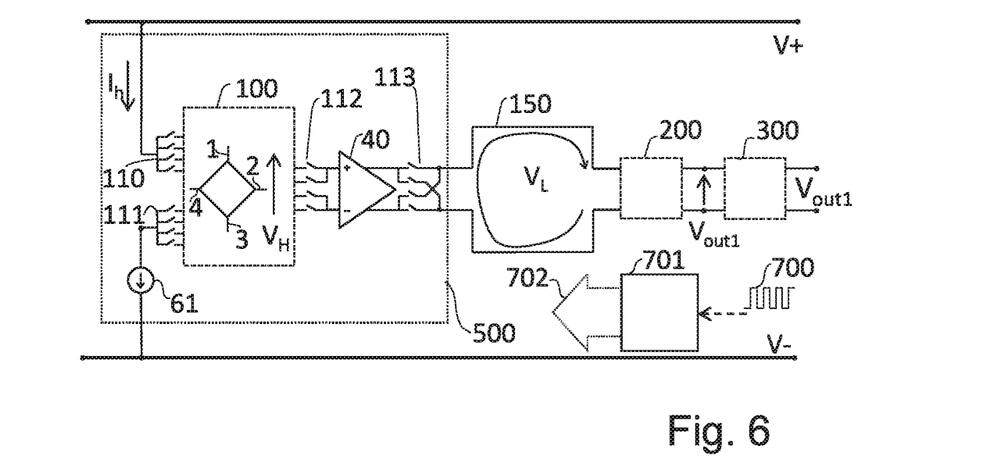
FIG. 6 a block diagram of another preferred magnetic field sensor system with a Hall magnetic field sensor subsystem.

FIG. 1 shows a block diagram of a typical Hall magnetic field sensor subsystem 500 known from the prior art in form of an integrated circuit (IHMFS—Integrated Hall Magnetic Field Sensor) with a Hall effect sensor 100, which is operated in spinning current mode with the switches 110 and 111 and which is with the switches 112 and 210 chopper stabilized. The Hall effect sensor 100 is, as also shown in FIGS. 5, 6, a Hall effect sensor element with corresponding common peripheral circuitry. For this purpose, the switchable contacts embodied as switches 110, 111 and 112 on both sides of inputs and outputs of the Hall effect sensor 100 convert the Hall voltage $V_H$ into an AC voltage with a frequency 702 predetermined by the clock signal 700 for controlling the switches 110, 111, 112 and 210 by the control unit 701, while the offset and low frequency noise of the Hall effect sensor 100 remain unchanged. The switches 210 between the amplifier 40 and the low pass filter 200 demodulate (or rectify) the amplified Hall voltage $V_H$ so that the Hall voltage $V_H$ reverts to its original baseband. Simultaneously, the switches 210 convert the amplified offset and/or low frequency noise from the Hall effect sensor 100 and the amplified offset and low frequency noise from the amplifier 40 into an AC signal. The low pass filter 40 filters out spurious AC voltages and switching spikes caused by the switches 110, 111 and 112. As a result of this signal conversion, the output voltage Vout is applied between the two output terminals of the low-pass filter 200, which corresponds to the amplified Hall voltage $V_H$ and is free of offset and low-frequency excess noise as a result. The output voltage Vout fulfils the condition $$V_{out} = G * V_H \quad (1)$$

whereas G is the gain of the amplifier 40. The switches 111 pull the Hall effect sensor 100 in the closed state via the current sink 61 to the potential v−.

Typically, an IHMFS with a bandwidth (BW) of DC to 500 Hz is limited by a first-order order low pass filter 200 with a cut-off frequency $f_c$=500 Hz. It typically comprises as sensor element typically a Hall effect sensor 100 with an absolute sensitivity $S_H$=0.1 V/T, an output resistance of $R_H$=500Ω and a thermal noise voltage spectral density of the Hall effect sensor 100 of $V_{Hn}$=2.8 nV√Hz.

The input-referred noise voltage $V_{an}$ of the integrated amplifier 40, including the parasitic noise of the spinning current current mode together with a chopper stabilization, also referred to as a spin chopper system, has a value of 10 nV√Hz. Thus, the total input-related noise voltage of the IHMFS is $V_{tn}$=10.4 nV√Hz. The value of $S_{NEMF-SD}$ of the IHMFS is thus obtained as $S_{NEMF-SD}$=$V_{tn}$/$S_H$=104 nT√Hz and $BW_n$=$f_c$*π/2=785 Hz. Consequently, for the integrated noise-equivalent magnetic field of the IHMFS is $B_n$=$S_{NEMF-SD}$*√BWn=2.9 μTrms.

Figure 2:
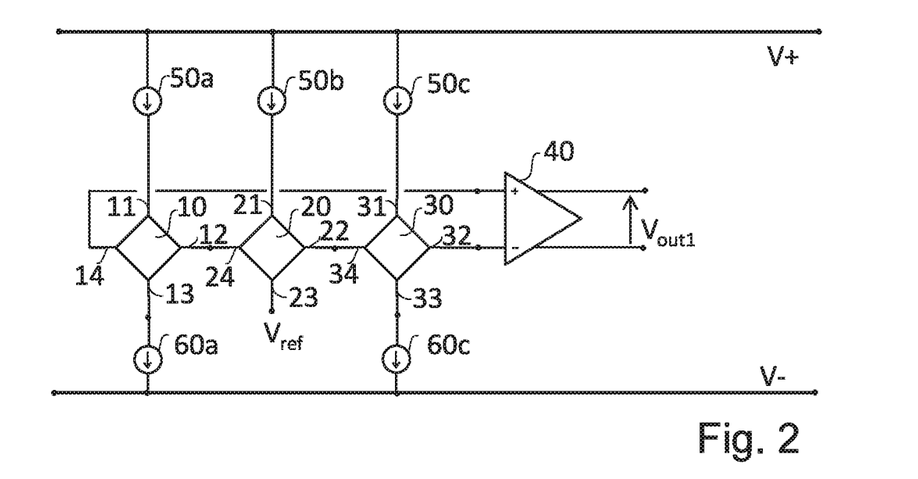
FIG. 2 a block diagram of a preferred magnetic field sensor system with three in series connected Hall effect sensors.
Figure 3:
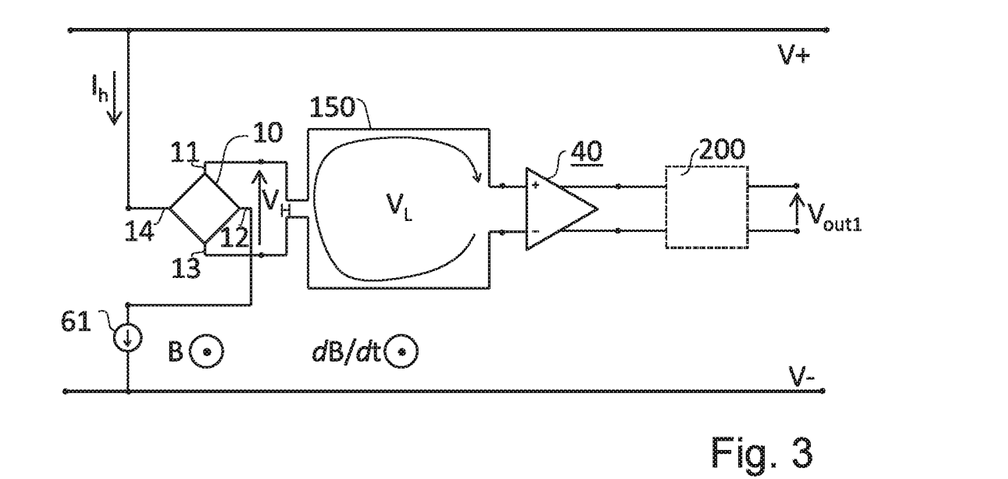
FIG. 3 a block diagram of a preferred magnetic field sensor system with Hall effect sensors connected in series with an induction loop.
Figure 4:
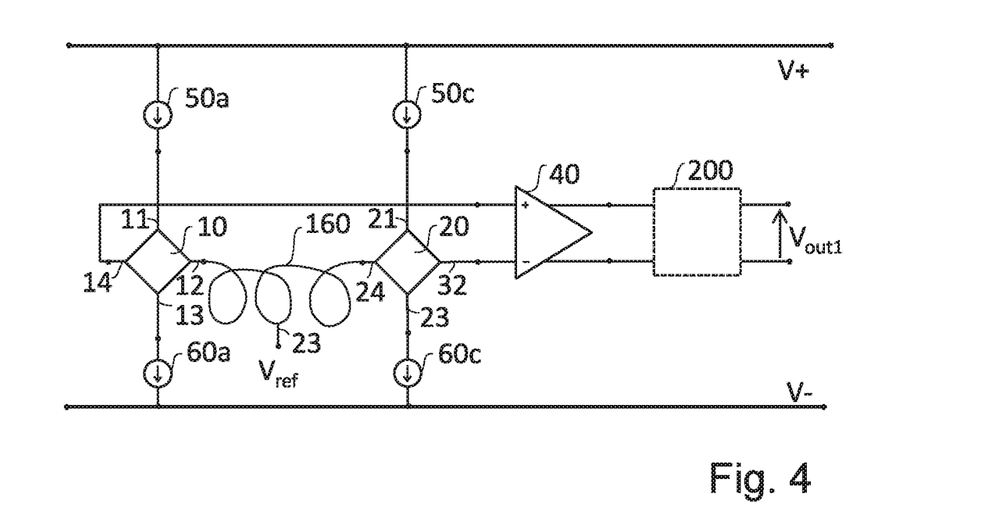
FIG. 4 a block diagram of a preferred magnetic field sensor system with two Hall effect sensors connected in series with an induction loop.

FIG. 2 shows a block diagram of an embodiment of a magnetic field sensor system with three Hall effect sensors 10, 20, 30, wherein the three Hall effect sensors 10, 20, 30 are connected in series in order to add-up the three output signals present at the respective outputs 12, 22, 32 of the Hall effect sensors 10, 20, 30 to a common input signal for the amplifier 40. The Hall effect sensors 10, 20, 30 are just as also illustrated in FIGS. 3 and 4, pure sensor elements, usually also referred to as Hall elements. The Hall effect sensor 10 is operated at terminal 11 by the current source 50a applied to the potential v+ on one side, and at terminal 13 by the current sink 60a applied to the potential v− on the other side. The Hall effect sensor 20 is operated at terminal 21 by the current source 50b applied to the potential v+ and by means of a reference voltage $V_{ref}$ applied to terminal 23. The Hall effect sensor 30 is operated at terminal 31 by the current source 50c applied to the potential v+ on one side, and at terminal 33 by the current sink 60c applied to the potential v− on the other side. In the present embodiment example, only this special arrangement of the current source 50a, 50b, 50c as well as the two current sinks 60a and 60c in connection with the applied reference voltage $V_{ref}$ enables the series connection of the Hall effect sensors 10, 20, 30 and the resulting adding up of the individual output signals to a larger input signal for the amplifier 40.

FIG. 3 shows a block diagram of a magnetic field sensor system comprising a Hall effect sensor 10 with terminals 11, 12, 13, 14, wherein the Hall voltage $V_H$ being applied to terminals 11 and 13, and an induction loop 150, an amplifier 40 and an optional low-pass filter 200, of which all are connected in series. The Hall effect sensor 10 and the induction loop 150 are thereby interconnected such that the phase of the voltage $V_L$ induced in the induction loop 150 is leading, preferably by π/2, with respect to the phase of the Hall voltage $V_H$. The decisive factor here is the direction of flow of the bias current $I_h$ of the Hall effect sensor 10, which can be taken from FIG. 3. The voltage $V_L$, which is proportional to the time derivative of the magnetic field dB/dT, is proportional to the frequency f of the magnetic field B. The first-order low-pass filter 200 preferably has a transfer function which is exactly inversely proportional to the added-up sensor voltages $V_H$+$V_L$, in order to eliminate the frequency dependency of the sensor voltages $V_H$+$V_L$. The cut-off frequency $f_c$ of the low-pass filter 200 satisfies the condition $$f_c=S_H/(2*\pi*A) \qquad (2)$$

where $S_H$ is the absolute magnetic sensitivity of the Hall effect sensor 10 and A is the area of the inductive loop 150.

In the case of an inductive coil 160 instead of an induction loop 150 as shown in FIG. 3, the area for (2) would be given by $$A=N_c \times A_a, \qquad (3)$$

where $N_c$ is the number of windings of the coil 160, and $A_a$ is the average area of a winding of the coil 160.

The magnetic sensitivity of the Hall effect sensor 10 is given by $$S_h=S_v*I_h \qquad (4)$$

or alternatively by $$S_h=S_v*V_{bh} \qquad (5)$$

where $S_i$ is the current-related sensitivity, $S_v$ is the voltage-related sensitivity, and $V_{bh}$ is the bias voltage of the Hall effect sensor 10.

The noise bandwidth of the series connection is given by the cut-off frequency of the low-pass filter 200 as follows $$B_{wn}=f_c*\pi/2 \qquad (6)$$

The maximum frequency $f_m$ and maximum amplitude $B_m$ of the measured magnetic field are valid because of the maximum voltage $V_m$ applied to the output of the amplifier 40:

$$f_m*B_m<V_m*f_c/(S_h*G) \qquad (7)$$

respectively $$f_m*B_m<V_m/(2*\pi*A*G) \qquad (8)$$

where $$V_m \leq V_{sup}, \qquad (9)$$

with $V_{sup}$ as supply voltage of the magnetic field sensor system.

If the maximum amplitude of the measured magnetic field $B_m$ is small enough, then according to equation (7) the maximum frequency $f_m$ of the magnetic field B can be much higher than, for example, the cut-off frequency $f_c$ of the low-pass filter 200, that is $$f_m>(10-100)*f_c \qquad (10)$$

Considering equation (6), this means that the integral white noise of a magnetic field sensor system comprising a series connection of a Hall effect sensor 10 and an induction loop 150 as shown in FIG. 3, is typically three to ten times lower than a magnetic field sensor system without induction loop 150.

Furthermore, the output voltage Vout is applied to the output terminals of this series connection. The electrical supply of the series connection is provided via the potentials v+ and v− in connection with the current sink 61. Furthermore, the alignment of the sensor 10 to the magnetic field is drawn.

FIG. 4 shows a block diagram of a preferred magnetic field sensor system with two Hall effect sensors 10 and 20 and an induction coil 160, which are connected in series in order to add-up the three output signals present at the respective terminals 24 and 14 of the Hall effect sensors 10 and 20 and the induction coil 160 connected in between to a common input signal for the amplifier 40. The Hall effect sensor 10 is operated at terminal 11 by the current source 50a applied to the potential v+ on one side, and at terminal 13 by the current sink 60a applied to the potential v− on the other side. The Hall effect sensor 20 is operated at terminal 21 by the current source 50c, which is connected on the one hand to the potential v+, and at terminal 23 by the current sink 60c, which is connected on the other hand to the potential v−, analogously to FIG. 3.

For the cut-off frequency $f_c$ adapted for this purpose, the following applies in generalized form according to equation (2):

$$f_c = N_h * S_h / (2*\pi*A) \quad (11)$$

where $N_h$ is the number of Hall effect sensors connected in series 10, 20. In present embodiment is $N_h=2$.

According to equations (11), (3) and (6), by using a coil 160 with multiple windings instead of a single induction loop 150, it is possible to reduce the noise bandwidth of the magnetic field sensor system and thus improve its magnetic resolution.

In preferred embodiments of the magnetic field sensor system shown in FIG. 4, the coil 160 and the Hall effect sensors 10, 20 have matched geometric and electrical symmetry that helps to suppress common mode noise signals. The reference voltage $V_{ref}$ defines a suitable common mode voltage at the input of the amplifier 40.

Furthermore, preferred embodiments of the magnetic field sensor system shown in FIG. 4 include on the output side a low-pass filter 200.

Typically, a preferred embodiment of a magnetic field sensor system has an IHMFS with a bandwidth BW of DC to at least 500 Hz and at most to 100 kHz. It typically comprises the series connection of the coil 160 with the two Hall effect sensors 10, 20 ($N_h=2$) shown in FIG. 4. Each of the two Hall effect sensors 10, 20 has a respective absolute sensitivity of $S_H=0.1$ V/T, a respective output resistance of $R_H=1000\Omega$, and all of the two Hall effect sensors 10, 20 together have a thermal noise voltage spectral density of $V_{Hn}=5.7$ nV√Hz. The coil 160 comprises an average winding area $A_a$ of 5 mm×5 mm=25 mm2. With $N_c=50$ windings and a wire diameter of 0.025 mm, a copper wire results in a coil resistance of 34 ohms and a thermal noise voltage of 0.7 nV√Hz.

The input related noise voltage $V_{an}$ of the integrated amplifier 40, including the parasitic noise of the spinning current operation together with chopper stabilization, has a value of 10 nV√Hz at a gain of 100.

Thus, the total input referred related voltage of the IHMFS at a frequency f<<cut-off frequency $f_c$ is $V_{tn}=11.5$ nV√Hz, and the value of the $S_{NEMF-SD}$ of the IHMFS is $S_{NEMF-SD}=V_{tn}/(N_h*S_H)=58$ nT√Hz. With the cut-off frequency of the low-pass filter $f_c=N_h*S_H(2*\pi*A)=25.5$ Hz, the noise bandwidth is $BW_n=f_c*\pi/2=785$ Hz.

Consequently, for the integrated noise-equivalent magnetic field of the IHMFS, $B_n=S_{NEMF-SD}*\sqrt{BW_n}=0.37$ μTrms.

As a result, this preferred embodiment of the invention has up to a factor of 8 less noise than the prior art according to FIG. 1.

The application limits result as derived above for example at $V_m=5V$ and $f_m=500$ Hz with $f_m*B_m<V_m*f_c/(N_h*S_H*G)$ to $f_m*B_m<6.7$ T/s and in the result to $B_m<12.7$ mT.

FIG. 5 shows a block diagram of a preferred magnetic field sensor system comprising a Hall effect sensor 100 and an induction loop 150, the output terminals of these devices being connected in series as also shown in FIG. 3. In FIG. 5, the Hall effect sensor 100 is spinning current and is chopper-stabilized. Therefore, the switches 110, 111 and 112 at both inputs and outputs of the Hall effect sensor 100 convert the Hall voltage $V_H$ into an AC voltage at a frequency 702 determined by the clock signal 700 for control of switches 110, 111 and 112 by the control unit 701, while the offset and low-frequency noise of the Hall effect sensor 100 remain unchanged. The switch 112 serially switches Hall voltage $V_H$ to the inductor loop 150. The output voltage $V_H+V_L$ then added-up to the inputs of switch 113 is serially switched for amplification to amplifier 40. The switches 210 between the amplifier 40 and the optional low pass filter 200 demodulate (or rectify) the amplified Hall voltage $V_H$ so that it returns to its original baseband. Simultaneously, the switches 210 convert the amplified offset and/or low frequency noise from the Hall effect sensor 100 and the amplified offset and low frequency noise from the amplifier 40 into an AC signal. The low pass filter 40 filters out spurious AC voltages and switching spikes caused by the switches 110, 111 and 112. As a result of this signal conversion, the output voltage Vout is applied between the two output terminals of the optional low pass filter 200 or the output signal OUT is applied to between the output terminals of another series connected device 300, preferably an output amplifier or an analog-to-digital converter. As a result, $V_H$ signals are free of offset and low frequency excess noise, and where appropriate the output signal OUT is digitized. The output voltage Vout satisfies condition (1). The switches 111 pull in closed state the Hall effect sensor 100 across the current sink 61 to the potential v−.

Furthermore, preferred embodiments of the magnetic field sensor system shown in FIG. 5 comprise a low-pass filter 200 on the output side, preferably implemented by means of switchable capacitors.

FIG. 6 shows a block diagram of another preferred magnetic field sensor system comprising a Hall magnetic field sensor subsystem 500 of FIG. 1, wherein between the demodulation switches 112 and the optional low pass filter 200 indicated by dashes an induction loop 150 with output voltage $V_L$ is connected in series.

At the output of the Hall magnetic field sensor subsystem 500, the amplified Hall voltage $V_H$ is present according to equation (1). For this reason, instead of equation (2), the sufficient cut-off frequency $f_c$ of the low-pass filter 200 is given by $$f_c = G*S_h/(2*\pi*A) \quad (12)$$

where G denotes the gain of the amplifier 40 within the Hall magnetic field sensor subsystem 500. Comparing both equations (2) and (12), it can be seen that repositioning the induction loop 150 from the input of the amplifier 40 to the output of the amplifier 40 is accompanied by an increase in the cut-off frequency $f_c$ of the low-pass filter 200 by a factor G where G>1.

Furthermore, due to the repositioning of the induction loop 150, the maximum frequency $f_m$ and the maximum amplitude $B_m$ of the measured magnetic field B are no longer given by equations (7) or (8), but rather $$f_m*B_m < V_m*f_c/(S_h) \quad (13)$$

respectively $$f_m*B_m < V_m/(2*\pi*A) \quad (14)$$

The product of the maximum frequency $f_m$ and the maximum amplitude $B_m$ therefore increases by the factor G with G>1.

If both output signals, i.e. the output voltage $V_H$ of the Hall effect sensor 100 and the output voltage $V_L$ of the induction loop 150 are amplified by the same factor G, the magnetic field sensor system is particularly suitable for the low-frequency range from DC up to 1 kHz.

If the output voltage $V_H$ of the Hall effect sensor 100 is amplified more than the output voltage $V_L$ of the induction loop 150, the magnetic field sensor system is particularly suitable for broadband high frequency operation from DC to 2 MHz.

Figure 7:
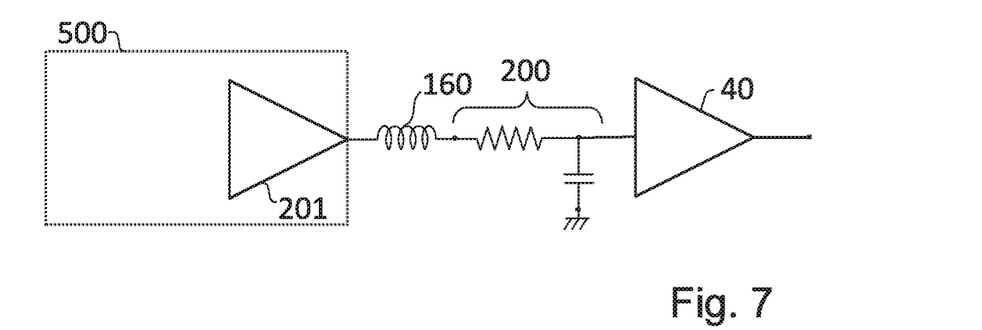
FIG. 7 a block diagram of a preferred magnetic field sensor system comprising a Hall magnetic field sensor subsystem.

FIG. 7 shows a block diagram of a preferred magnetic field sensor system comprising a Hall magnetic field sensor subsystem 500 with an integrated output amplifier 201 and a downstream non-integrated induction coil 160 to which the output voltage $V_H$ of the Hall magnetic field sensor subsystem 500 is applied as input voltage, an RC element as first-order low-pass filter 200 and an optional amplifier 40 shown in dashed lines, which are all connected in series. The embodiment shown is due to the variably configurable external inductor 160 particularly suitable for high-frequency measurement applications in a broadband frequency range from DC to 1 MHz, preferably up to 1.5 MHz and more particularly up to 2 MHz.

Both the cut-off frequency $f_c$ and the product $f_m*B_m$ are dependent on the effective area of the induction coil and, as shown in FIGS. 8 to 14, can therefore be shaped by form and design as well as number of windings of the coils.

Typically, a preferred embodiment of a magnetic field sensor system an IHMFS a bandwidth BW of DC to a maximum of 100 kHz. The IHMFS has a sensitivity of 100 V/T. It typically comprises the series connection shown in FIG. 7 of an IHMFS according to one of FIGS. 1 to 6 and the three Hall effect sensors 10, 20, 30, as well as the external coil 160 and the low-pass filter 200. Each of the three Hall effect sensors 10, 20, 30 has a respective absolute sensitivity of $S_H$=0.1 V/T, a respective output resistance of $R_H$=1000Ω, and all three Hall effect sensors 10, 20, 30 have together a spectral density of the thermal noise voltage $V_{Hn}$=6.9 nV√Hz.

The input related noise voltage $V_{an}$ of the amplifier 40 belonging to the IHMFS and already integrated therein has, including the parasitic noise of the spinning current current operation together with a chopper stabilization, a value of 10 nV√Hz at a gain of 100.

The sensitivity of the IHMFS is given by $S_{IHMFS}=N_h*S_H*G=30$ V/T.

The total input-referred noise voltage of the IHMFS is found to be $V_{tn}$=11.5 nV√Hz when the frequency f<<cut-off frequency $f_c$, and the value of $S_{NEMF-SD}$ of the IHMFS is found to be $S_{NEMF-SD}=V_{tn}/(N_h*S_H)=58$ nT√Hz.

The external coil 160 comprises an average winding area $A_a$ of 5 mm×5 mm=25 mm2, has $N_c$=20 windings and an area A of $5*10^{-4}$ m$^2$.

With the cut-off frequency of the external low-pass filter $f_c=G\ N_h*S_H/(2*\pi*A)=9.5$ kHz, the noise bandwidth becomes $B_{Wn}=f_c*\pi/2=14.9$ kHz.

Consequently, for the integrated noise equivalent magnetic field of the preferred embodiments of a magnetic field sensor system, $B_n=S_{NEMF-SD}*\sqrt{BWn}=4.9\mu_{Trms}$.

The application limits result as derived above, for example, with Vm=10V and $f_m*B_m<V_m/(2*\pi*A)$ to $f_m*B_m<3.2*10^3$ T/s. Thus, with a maximum magnetic field of $B_m$=3 mT, a maximum frequency $f_m$ of 1 MHz would be possible.

Figure 8:
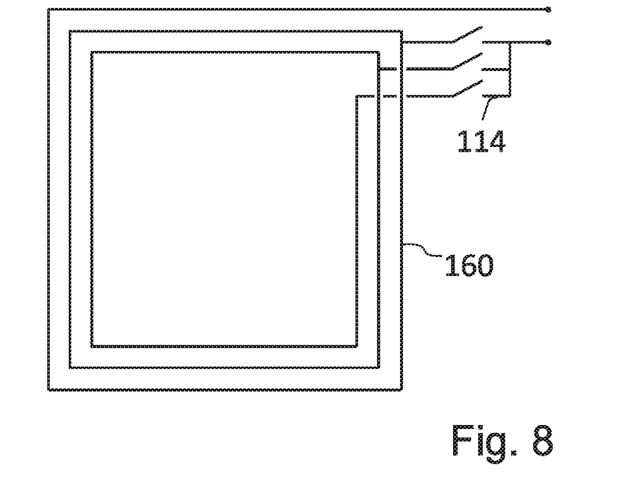
FIG. 8 a schematic representation of a preferred embodiment of an induction coil manufactured using planar technology.

FIG. 8 shows a schematic representation of an embodiment of an induction coil 160 manufactured in planar technology, which is preferably integrated on a chip with further components of the magnetic field sensor system. The number of windings is freely selectable in accordance with the application via the selector switch 114 with the three switchable windings shown schematically. The winding number-dependent area A of the induction coil 160 can be varied far beyond these schematically illustrated three windings in an application-related manner.

Figure 9:
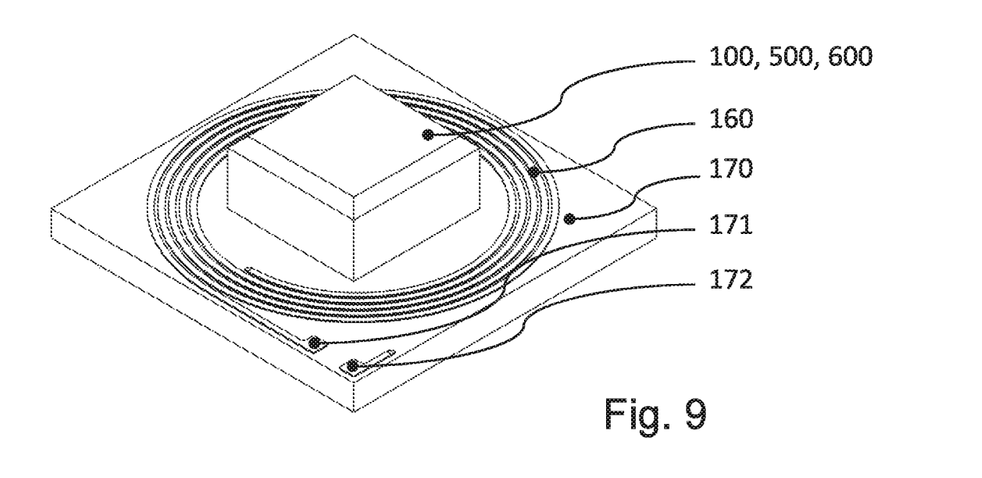
FIG. 9 a schematic representation of a preferred embodiment of a chip on a base plate.

FIG. 9 shows a schematic illustration of one embodiment of a chip 600 on a base plate 170 surrounded by a coil assembly 160 arranged parallel to the chip surface on the base plate 170, with windings extending around the chip 600. The coil 160 has terminals 171, 172 in the form of bond pads. In accordance with the invention, the chip 600 comprises a magnetic field sensor subsystem.

Figure 10A:
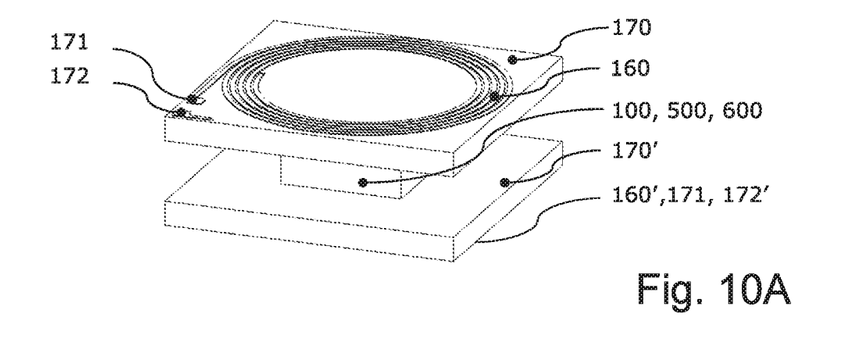
FIGS. 10A to 10C, respectively, a schematic representation of a preferred embodiment comprising a sandwich-like arrangement of a chip.
Figure 10B:
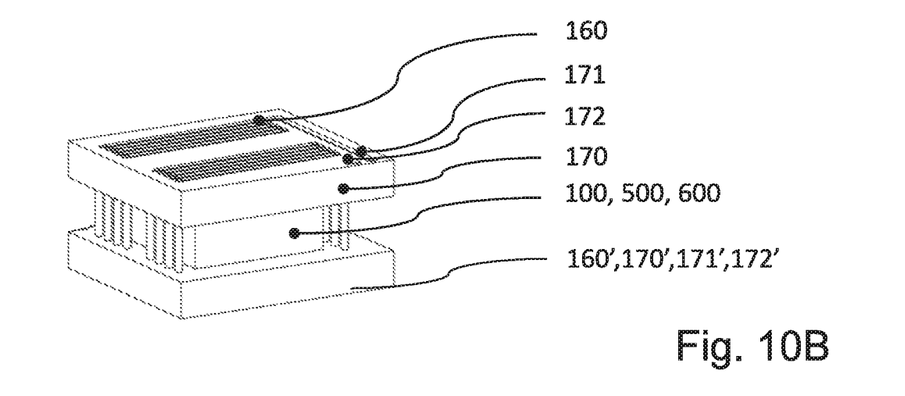
Figure 10C:
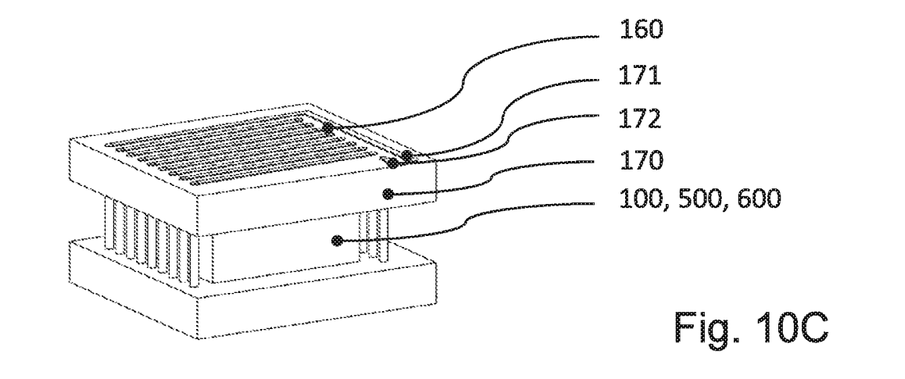

FIG. 10A to FIG. 10C show schematic representations of preferred embodiments comprising a sandwich-like arrangement of the chip 600 between a top plate 170 and a bottom plate 170', respectively. In FIG. 10A, the two plates 170, 170' each have a coil 160, 160' with respective connections 171, 172 and 171', 172' in the form of bond pads on the surfaces facing the chip 600. In FIG. 10B, the coil 160 with the two coil structures 161, 162 is spatially configured in such a way that between the two coil structures 161, 162 with their respective windings a spatial spacing is introduced which corresponds to at least 10% of the width of one of the two coil structures 161, 162, so that the windings of the two coil structures 161, 162 run around the chip 600 on and/or integrated in the cover plate 170 and in the base plate 170'. The two coil structures 161, 162 may be electrically connected to each other such that they act as one coil 160 or may act electrically independently of each other as two individual coils 160.

In FIG. 10C, the windings of the coil 160 circulate around the chip 600 without any spacing between the two coil structures 161, 162 as shown in FIG. 10b.

Figure 11A:
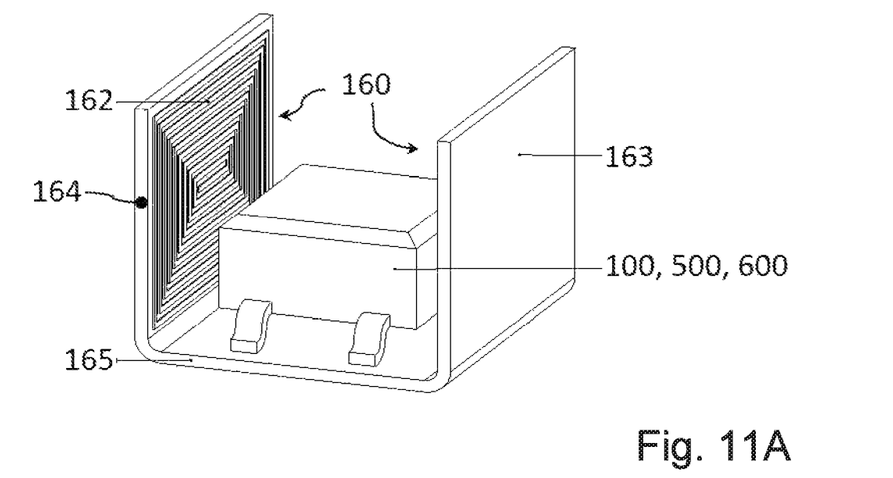
FIGS. 11A to 11C, a schematic representation of a preferred embodiment of an induction coil with its windings arranged perpendicular to the surface of a chip.

FIG. 11A shows a schematic representation of an embodiment of two coil structures 161, 162 arranged with their windings perpendicular to the surface of the chip 600 on a substrate comprising side walls 163, 164 and bottom plate 165, which substrate has been manufactured by folding or bending the coil structure 161, 162, preferably made of so-called flexible flexprint circuit board material or rigid flexprint circuit board material or also any rigid or flexible board material, preferably u-shaped. Preferably, the coil structures 161, 162 are made using planar technology. Also layable windings made out of wire are possible. The two coil structures 161, 162 are electrically interconnectable to form one coil 160 or two independently acting coils 160.

Figure 11B:
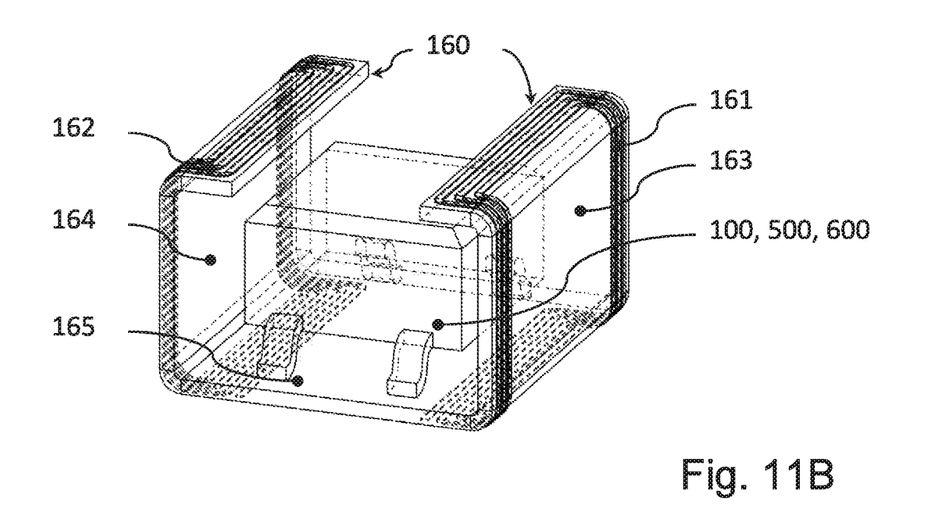
Figure 11C:
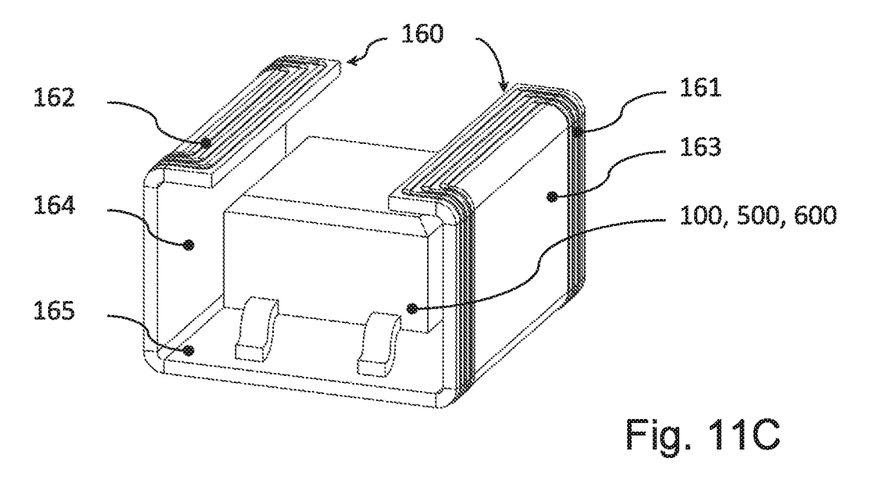

FIGS. 11B and 11C show the embodiment illustrated in FIG. 11A with coil structures 161, 162 respectively applied to the side walls 163, 164. From the visual and transparent line representation in FIG. 11C, it can be seen that the coil structures 161, 162 together with the base plate 165 each surround a chip 600 in a U-shape, since they also partially extend into and/or onto the base plate 165. The two coil structures 161, 162 can be electrically interconnected to form a coil 160 or two independently acting coils 160.

Figure 12A:
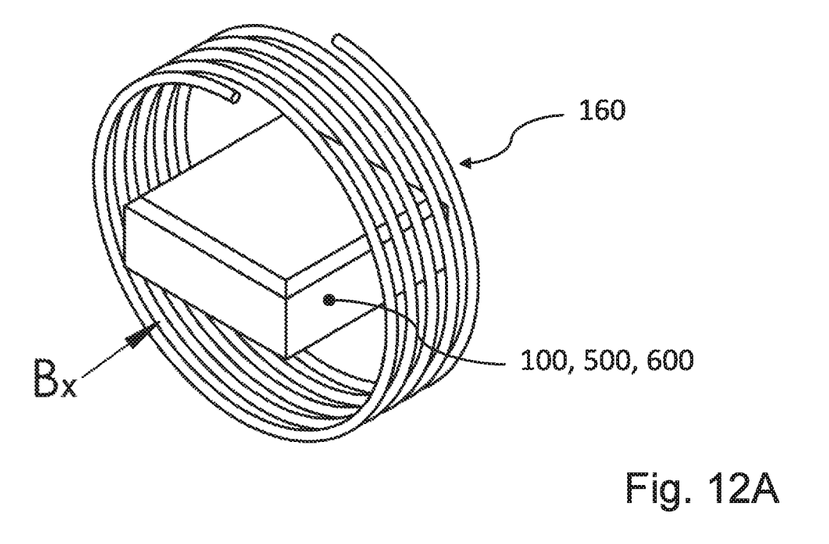
FIGS. 12A to 12C, respectively, a schematic illustrations of a preferred embodiment of an indicated coil wound around a chip.
Figure 12B:
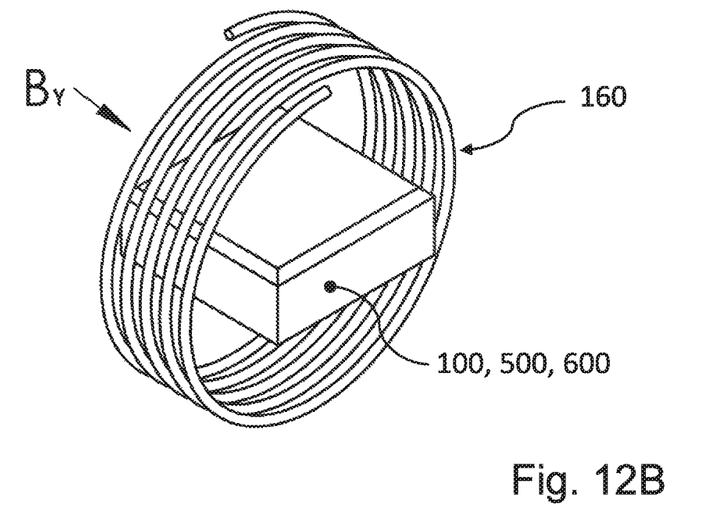
Figure 12C:
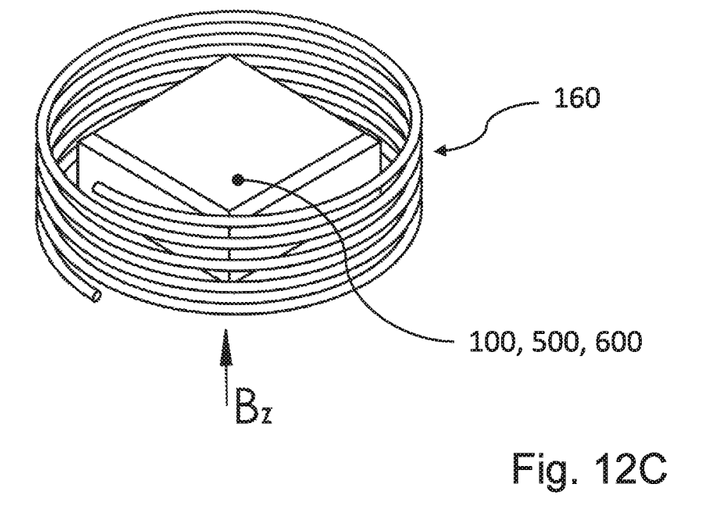

FIGS. 12A to 12C each show a schematic representation of an indicated coil 160 wrapped around the chip 600 in three different configurations corresponding to the three different orthogonal scanning directions of the magnetic field, namely the spatial direction components $B_x$, $B_y$, $B_z$.

Figure 13:
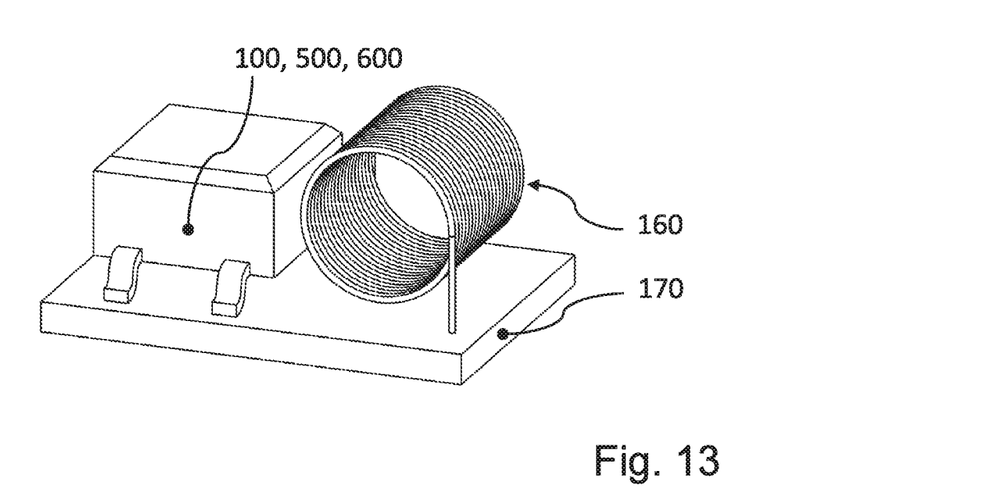
FIG. 13 a schematic representation of a preferred embodiment of a chip including an air coil arrangement.

FIG. 13 shows a schematic representation of a preferred embodiment of a chip 600, on a base plate 170 with a coil 160 in the form of an air coil arranged thereon on one side of the chip 600.

Figure 14:
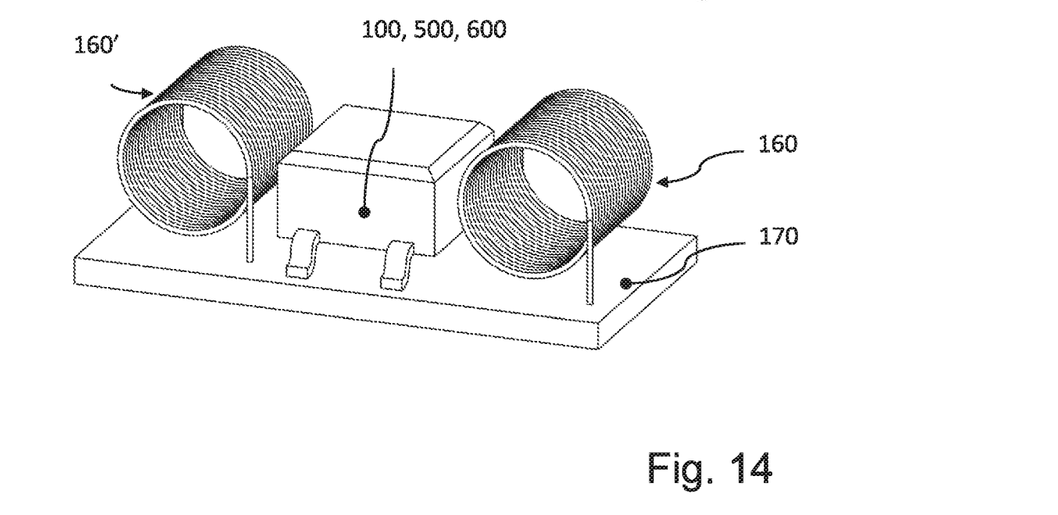
FIG. 14 a schematic representation of another preferred embodiment of a chip including an air coil arrangement.

FIG. 14 shows a schematic representation of a preferred embodiment of a chip 600 on a base plate 170 with two coils 160, 160' arranged thereon in the form of two air coils. The coils 160, 160' are arranged in parallel with their windings in a sandwich-like manner on two opposite sides of the chip 600.

The invention claimed is:

1. A magnetic field sensor system comprising:
a first magnetic field sensor;
one or more second magnetic field sensors; and
an amplifier;
wherein the first magnetic field sensor and one or more of the second magnetic field sensors is a device selected from the group consisting of Hall effect sensors, magnetoresistive sensors in, preferably Wheatstone's, bridge circuit, induction loops or induction coils or any combination thereof;
wherein the magnetic field sensor system—in the presence of an induction loop or an induction coil as part of the magnetic field sensor system—additionally comprises an integrator or a low-pass filter for compensating a frequency dependence of a voltage induced in the induction loop or the induction coil;
and all magnetic field sensors are connected in series, so that the respective output signals can be added-up to a common input signal of the amplifier.

2. The magnetic field sensor system of claim 1, wherein a supply contact of the first magnetic field sensor is connected to a voltage source, and all remaining supply contacts of the magnetic field sensors are each connected to a constant current source or to a constant current sink.

3. The magnetic field sensor system according to claim 1, wherein the first magnetic field sensor is connected in combination with at least one component selected from the group consisting of Hall effect sensors, magnetoresistive sensors, induction loops or induction coils, and a further amplifier, and wherein the component is connected upstream of the further amplifier.

4. The magnetic field sensor system according to claim 1, wherein the magnetic field sensor system and/or a magnetic field sensor subsystem comprises switchable contacts for a spinning current operation of the first magnetic field sensor and/or a chopper stabilization of the amplifier.

5. The magnetic field sensor system according to claim 1, wherein, in the presence of a combination of a Hall effect sensor or a magnetoresistive sensor and an inductive element as part of the magnetic field sensor system, the inductive element is connected such that the phase of a voltage $V_L$ induced therein is leading relative to the phase of the voltage of the Hall effect sensor or the magnetoresistive sensor wherein the inductive element is an inductive loop or an inductive coil.

6. The magnetic field sensor system according to claim 4, wherein the first magnetic field sensor and/or at least one of the second magnetic field sensors and/or the magnetic field sensor subsystem is embodied as an integrated circuit.

7. The magnetic field sensor system according to claim 3, wherein the first magnetic field sensor in combination with the at least one further component is embodied as an integrated circuit, and its output is connected in series with an induction loop or an induction coil in order to add-up the output signals.

8. The magnetic field sensor system according to claim 7, wherein the integrated circuit comprises at least one Hall effect sensor and an induction loop or an induction coil for at least one spatial direction component of a magnetic field vector, such that one, two or three spatial direction components of the magnetic field vector are detectable.

9. The magnetic sensor system according to claim 7, wherein the integrated circuit comprises at least one Hall effect sensor for at least one spatial direction component of a magnetic field vector, and the induction loop or loops or coil or coils or a combination thereof at least partially spatially surround the integrated circuit such that one, two or three spatial direction components of the magnetic field vector are detectable.

10. The magnetic field sensor system according to claim 1, comprising a Hall effect sensor and an inductive component connected in series, wherein both the output signal of the Hall effect sensor and the output signal of the inductive component are amplified by the same factor so that a magnetic field measuring range of 5 mT (milliteslas) to 3 T (teslas) in a low frequency range with a bandwidth of 0 Hz (hertz) (DC direct current) to 1 kHz (kilohertz) can be covered with a measuring resolution of 500 nT (nanoteslas).

11. The magnetic field sensor system according to claim 1, comprising a Hall effect sensor and an inductive component connected in series, wherein the output signal of the Hall effect sensor is amplified more strongly than the output signal of the inductive component so that a magnetic field measuring range of 5 mT (milliteslas) to 300 mT in a medium frequency range with a bandwidth of 0 Hz (hertz) (DC—direct current) to 200 kHz (kilohertz) can be covered with a measuring resolution of 5 mT.

12. The magnetic field sensor system according to claim 1, comprising a Hall effect sensor and an inductive component connected in series, wherein the output signal of the Hall effect sensor is amplified more strongly than the output signal of the inductive component so that a magnetic field measuring range of 3 mT (milliteslas) to 30 mT in a high frequency range with a bandwidth of 0 Hz (hertz) (DC—direct current) to 2 MHz (megahertz) can be covered with a measuring resolution of 15 µT (microteslas).

* * * * *